(12) United States Patent
Deckers

(10) Patent No.: US 12,408,482 B2
(45) Date of Patent: Sep. 2, 2025

(54) LIGHTING ELEMENT ALIGNMENT

(71) Applicant: LUMILEDS LLC, San Jose, CA (US)

(72) Inventor: Michael Deckers, Jülich (DE)

(73) Assignee: Lumileds LLC, San Jose, CA (US)

( * ) Notice: Subject to any disclaimer, the term of this patent is extended or adjusted under 35 U.S.C. 154(b) by 382 days.

(21) Appl. No.: 18/018,466

(22) PCT Filed: Jul. 28, 2021

(86) PCT No.: PCT/US2021/043439
§ 371 (c)(1),
(2) Date: Jan. 27, 2023

(87) PCT Pub. No.: WO2022/026539
PCT Pub. Date: Feb. 3, 2022

(65) Prior Publication Data
US 2023/0268457 A1  Aug. 24, 2023

Related U.S. Application Data

(60) Provisional application No. 63/058,015, filed on Jul. 29, 2020.

(30) Foreign Application Priority Data

Aug. 19, 2020 (EP) .................... 20191659

(51) Int. Cl.
H10H 20/01 (2025.01)
H01L 23/00 (2006.01)
(Continued)

(52) U.S. Cl.
CPC .......... *H10H 20/018* (2025.01); *H01L 24/29* (2013.01); *H01L 24/32* (2013.01); *H01L 24/33* (2013.01);
(Continued)

(58) Field of Classification Search
CPC . H01L 2224/83139; H01L 2224/95136; H01L 2224/95001; H05K 2203/0156;
(Continued)

(56) References Cited

U.S. PATENT DOCUMENTS 10,186,549 B1 * 1/2019 Cheung ................ H01L 24/97
2010/0129026 A1 * 5/2010 Hodono ............... H05K 1/0269
29/829

(Continued)

FOREIGN PATENT DOCUMENTS

| CN | 109326685 A | 2/2019 |
|---|---|---|
| EP | 3343611 A1 | 7/2018 |
| EP | 3680933 A1 | 7/2020 |
| WO | 2005/099310 A2 | 10/2005 |
| WO | 2018/178140 A1 | 10/2018 |

OTHER PUBLICATIONS

The extended European search report corresponding to EP application No. 20191659.0, Feb. 5, 2021, 9 pages.
(Continued)

*Primary Examiner* — Nduka E Ojeh

(57) ABSTRACT

The invention refers to a method for assembling at least one lighting element onto a substrate, the method comprising: pre-assembling at least one lighting element onto a temporary carrier; pre-assembling at least one reference element onto the temporary carrier; aligning the pre-assembled temporary carrier onto the substrate based, at least in part, on the at least one reference element of the temporary carrier; and mounting the at least one lighting element onto the substrate. The invention further relates to substrate comprising: at least one lighting element, wherein the at least one lighting element is assembled onto the substrate, in particular by a method according to the first aspect of the present invention, and to a use of a method for assembling at least one lighting element onto a substrate.

19 Claims, 7 Drawing Sheets

(51) Int. Cl.
  *H01L 25/075* (2006.01)
  *H10H 20/855* (2025.01)
(52) U.S. Cl.
  CPC .............. *H01L 24/83* (2013.01); *H01L 24/95* (2013.01); *H01L 25/0753* (2013.01); *H10H 20/855* (2025.01); *H01L 2224/29021* (2013.01); *H01L 2224/32227* (2013.01); *H01L 2224/33517* (2013.01); *H01L 2224/83139* (2013.01); *H01L 2224/83815* (2013.01); *H01L 2224/95001* (2013.01); *H01L 2224/95136* (2013.01)
(58) Field of Classification Search
  CPC ....... H05K 2203/016; H05K 2203/166; H05K 3/303
  See application file for complete search history.

(56) References Cited

U.S. PATENT DOCUMENTS

| | | | |
|---|---|---|---|
| 2020/0185293 A1* | 6/2020 | Schmalzl | H01L 21/4846 |
| 2020/0185333 A1* | 6/2020 | Higashisaka | H01L 25/065 |
| 2020/0219820 A1* | 7/2020 | Chen | H10H 20/8512 |

OTHER PUBLICATIONS

From the EPO as the ISA, Notification of the Transmittal of the International Search Report and the Written Opinion of the International Searching Authority, or the Declaration, PCT/US2021/043439, Nov. 11, 2021, 19 pages.

* cited by examiner

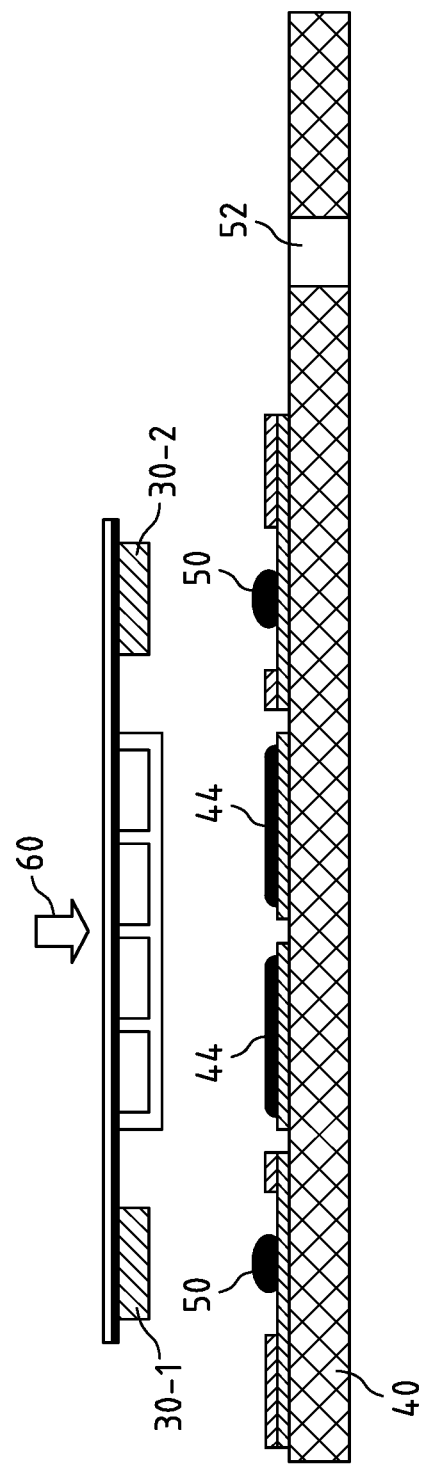

LIGHTING ELEMENT ALIGNMENT

CROSS REFERENCE TO RELATED APPLICATIONS

This application claims priority to International Application No. PCT/US2021/043439 filed on Jul. 28, 2021, which claims priority to European Patent Application 20191659.0 filed Aug. 19, 2020 and to U.S. Patent Application 63/058,015 filed Jul. 29, 2020. All of the above applications are incorporated herein by reference in their entirety.

FIELD OF THE INVENTION

The present disclosure relates to a method for aligning lighting element(s) onto a substrate for applications such as automotive lighting.

BACKGROUND OF THE INVENTION

For the automotive front lighting adaptive driving beam (ADB) market, so-called Level 1 (L1) light emitting diodes (LEDs) are known in which LEDs are mounted on printed circuit boards (PCBs). The light emitting diodes being mounted to a PCB represents a so-called L2 solution. Further, L2 solutions can contain further integration of electronic components and/or optical elements.

For instance, for LED Matrix ADB elements, it is a challenge to mount the LEDs precisely and align the pre-optics as optical elements in X-, Y- and Z-direction to the light emitting area of the LED. Typically, mechanical references like holes in the PCB are used for the alignment. For application in which the optics needs to be aligned with less than e.g. 100 μm tolerance, the positional tolerances of PCB drilled holes referenced to the receiving section (e.g. copper LED pads, also referred to as LED land pattern) to which the LEDs are to be mounted, and a proper mounting process becomes a key. Additional assembly steps like active alignment may be needed. Thus, the assembly is challenging, complex and thus an expensive process. Current solutions use more or less precisely CNC drilled holes in the PCB as well as gluing individual LEDs in reference to these holes before reflow soldering them permanently onto the PCB. Even if the LEDs are properly aligned, during the mounting, the LEDs may tilt leading to less accurate aligned LEDs.

SUMMARY OF THE INVENTION

It is, thus, an object of the invention to provide an accurate alignment of a lighting element such as an LED, which lowers the tolerance chain in an easy manner and reduces complexity during manufacturing.

The invention is defined in the claims.

According to a first aspect of the present invention above, the object is solved in that a method for assembling at least one lighting element onto a substrate is proposed, the method comprising: pre-assembling at least one lighting element onto a temporary carrier; pre-assembling at least one reference element onto the temporary carrier; aligning the pre-assembled temporary carrier onto the substrate based, at least in part, on the at least one reference element of the temporary carrier; and mounting the at least one lighting element onto the substrate.

According to a second aspect of the present invention, the object is solved by a substrate comprising: at least one lighting element, wherein the at least one lighting element is assembled onto the substrate, in particular by a method according to the first aspect of the present invention. The substrate may be a printed circuit board (PCB).

According to a third aspect of the present invention, a use of a method for assembling at least one lighting element onto a substrate is proposed, in particular of a method according to the first aspect of the present invention. The use may be for assembling one or more optical components with one or more lighting elements.

Exemplary embodiments of the first, second and third aspect of the invention may have one or more of the properties described below.

The temporary carrier may be a structure that provides mechanical support and stability to the lighting element(s), e.g. LED(s) during mounting on the substrate and optionally during later processing. Further, the temporary carrier may provide mechanical support during stocking and transportation, e.g. until it is utilized for the manufacturing process of mounting the lighting element(s) onto the substrate. Suitable materials for the temporary carrier include, for example, glass, ceramic, metal or plastic. The temporary carrier may be in the form of a foil, or comprise a foil enabling to remove the temporary carrier from the lighting element(s) and/or the reference element(s) after they are mounted onto the substrate.

The lighting element(s) is (are) pre-assembled onto the temporary carrier. Further, the reference element(s) is (are) pre-assembled onto the temporary carrier. Then, the temporary carrier comprising the lighting element(s) and the reference element(s) form a pre-assembly structure. Due to the reference element(s) comprised by the pre-assembled temporary carrier, very accurate alignment tolerance, e.g. of 100 μm or less is achieved for the accuracy of the lighting elements(s) in relation to the intended position of them on the substrate, since the reference element(s) ensure proper placement of the lighting element(s) before they are (permanently) mounted onto the substrate.

Further, the positioning of the lighting element(s) and the reference element(s) on the temporary carrier, and then using this pre-assembly structure to pre-fix the lighting element(s) on the substrate prior to the final mounting of the lighting element(s) is far less complex than the e.g. direct soldering, welding or gluing of the lighting element(s) (e.g. directly) to the substrate.

Thus, a lowering of the tolerance chain can be achieved by directly aligning the reference element together with the lighting element(s) (e.g. LEDs) to the temporary carrier before the mounting of them to the substrate. Since the attaching of the lighting element(s) and of the reference element(s) to the temporary carrier can be done by a pick and place process, and the lighting element(s) and of the reference element(s) are attached to the temporary carrier e.g. by gluing them to an adhesive layer of the temporary carrier, the lighting element(s) and of the reference element(s) can be very accurately placed onto the temporary carrier. This accuracy can be transferred to the position of the lighting element(s) and/or of the reference element(s) when they are mounted onto the substrate. Therefore, a temporary carrier with pre-assembled lighting element(s) which is joined by the reference element(s), e.g. representing a L1 element is used in the method according to the first aspect of the present invention representing a manufacturing process.

By using this pre-assembly structure, a standard SMT placement and e.g. reflow soldering can be used to mount (e.g. attach) either both the lighting element(s) (e.g. LEDs) and the reference element(s), or the lighting element(s) to the substrate (e.g. PCB). This may be done in one step, resulting in a low tolerance of the placement of the lighting element(s). Furthermore, tolerance in positions between the lighting element(s) and e.g. one or more optical elements (e.g. reflector or lens) to be aligned in relation to the lighting element(s) to the substrate, and e.g. as used in a lighting device can be reduced as well. For instance, in case the substrate is a PCB, tolerances from a solder pad to mechanically drilled holes that are commonly used for referencing of lighting element(s) when they are mounted onto the PCB are not required to be utilized in the tolerance chain. By using this method, a standard SMT production line without special equipment for alignment or gluing process can be used. The temporary carrier can be removed after the mounting of the lighting element(s) and/or the reference element(s) onto the substrate.

A respective reference element may be represented by one or more objects. These objects may be metal, glass, ceramic, or plastic, or comprise at least in part such materials. For instance, a respective reference element may be a (e.g. metal) disc, ring, rectangle or square, or of other shape, as far as reasonable for aligning the lighting element(s) onto the substrate. Also, the form of the reference element(s) may depend on the position at which the lighting element(s) need to be mounted. The reference element(s) may also have a single sided (e.g. metal) plating, e.g. enabling the reference element(s) to be soldered to the substrate. A placing of such reference element(s) can be done with a high precision die bonder to achieve low positional tolerance between the lighting element(s) and the reference element(s). The (e.g. mechanical) reference element(s) may have the same thickness as the lighting element(s). Then, the temporary carrier (e.g. comprising a foil or the main part being a foil) can be flat. For instance, the thickness of these reference element(s) may be the same as the height of the lighting element(s), e.g. if a flat temporary carrier is used. Also taller objects can be used with the temporary carrier if a cut-out is made for protruded sections or the protrusion is outside of the carrier area. Alternatively, the reference element(s) may not have the same thickness as the lighting element(s). Then, there can be a step on the surface of the temporary carrier. Large objects like a (e.g. temporary) frame for holding optical element(s) (e.g. reflector or lens) can be aligned to the lighting element(s) using this design. Such a frame may also represent a reference element within the meaning of the present invention.

Possible usage of such reference elements may be a) an optic containing a recess where the reference element fits into, b) the reference element(s) may have a hole where an optic has a protrusion fitting into, c) reference element(s) may be placed projecting the substrate (e.g. PCB) or towards a cut-out where the optics can snap into, and/or d) a secondary pin may be used to align a hole in the optics with a hole in the reference element(s), to name but a few non-limiting examples.

The proposed invention can use e.g. single die emitters or multi die emitters as lighting element(s). Further, phosphor converted white LEDs, and/or direct emitters emitting blue, red, and/or green light may be used in addition or in the alternative. The single die emitters or the multi die emitters are placed on (e.g. attached to) the temporary carrier (e.g. comprising or being an adhesive polyamide tape) together with one or more mechanical reference element(s).

According to an exemplary embodiment of the invention, the method further comprises: removing the temporary carrier from the substrate when the at least one lighting element is permanently attached to the substrate. After assembly e.g. of the final product, or of mounting the lighting element(s) onto the substrate, the temporary carrier can be removed. Thus, the temporary carrier may not be a part of the final product, e.g. comprising the substrate. The removing can be done by peeling of the temporary carrier. For instance, the temporary carrier may be a plastic film or foil that can be removed from e.g. an adhesive layer. The adhesive layer may also be comprised by the temporary carrier. The reference element(s) and the lighting element(s) may attach (e.g. stick to or be glued to) the adhesive layer in the pre-assembly structure.

According to an exemplary embodiment of the invention, the at least one reference element provides a mechanical stop for aligning the pre-assembled temporary carrier in at least one direction. In this way, a mechanical reference with good positional tolerance to the lighting element(s) can be provided for optics alignment, thus, optical elements such as reflector or lens. Additionally, an optical element can be aligned using the reference element(s) as mechanical reference element(s), e.g. as one or more mechanical stops, with low tolerance to the position of the lighting element(s) in X-, Y- and depending on design additionally in Z-direction. For instance, a pre-collimator optics can use these mechanical reference element(s) for X-, Y- and Z-alignment, thus, in three different directions.

According to an exemplary embodiment of the invention, the at least one reference element further comprises at least one fiducial providing a mechanical stop for aligning the pre-assembled temporary carrier in a third direction and/or for enabling optical alignment of the pre-assembled temporary carrier. Such a fiducial may be a small dent or a recess on a top side of the reference element(s). The fiducial may be utilized by a pick-and-place process since it can be optically recognized and it further enables alignment of other elements in relation to the fiducial. The fiducial may be formed into the reference element(s) by a stamping, or a punching process, or by deep drawing it into the reference element(s). This may be done prior to attaching the reference element(s) to the temporary carrier.

According to an exemplary embodiment of the invention, the at least one reference element at least temporarily fixes the at least one lighting element during its mounting in relation to the substrate by at least two degrees of freedom. In particular, the reference element(s) allow for a very accurate alignment of the lighting element(s) on the substrate. Further, the reference element(s) enable that the lighting element(s) do not change their position in relation to the substrate during the mounting, e.g. tilting of the lighting element(s) when the lighting element(s) are soldered or glued to the substrate can be prevented.

According to an exemplary embodiment of the invention, the pre-assembled temporary carrier is aligned to the substrate by a pick and place process. Such a pick and place process may be a standard surface mounting technology (SMT). The pre-assembly represented by the temporary carrier comprising the lighting element(s) and the reference elements(s) can be mounted to the substrate, e.g. a PCB, using the pick and place process. For instance, robots are used to pick up the temporary carrier with the lighting element(s) and the reference element(s) and place them to their intended position in relation to the substrate. Then, the lighting element(s), and additionally the reference element(s) are placed directly onto the substrate and they are surface mounted to the substrate (e.g. a PCB). The lighting element(s), and additionally the reference element(s) may be mounted by soldering (e.g. reflow soldering) and/or gluing (e.g. thermal glue) them onto the substrate. The thermal glue may be a thermal activated glue, or a ultraviolet (UV) activated glue.

According to an exemplary embodiment of the invention, the substrate is a printed circuit board (PCB). The PCB enables electrically coupling e.g. via conductive tracks of the lighting element(s) that are mounted to the PCB.

According to an exemplary embodiment of the invention, the at least one lighting element is mounted to the substrate by gluing or soldering it onto the substrate. The lighting element may be mounted to the substrate by gluing or soldering it onto the substrate. During soldering, a self-alignment of a lighting element to a copper feature of a PCB like a pad to which the lighting element is to be soldered may be achieved. The reference element(s) can be fixed with glue to the PCB during reflow soldering. Then, the glue e.g. can be applied to the PCB before the pre-assembly structure is placed onto the PCB. The SMT placement can then align e.g. the lighting element(s), e.g. in the form of a LED array, to the drilled holed of the PCB. Then, no shifting by self-alignment during reflow will happen.

By soldering the lighting element(s) onto the substrate, there may be a self-centring effect of the lighting element(s) since they can be bound only to a location of e.g. copper to which the lighting element(s) is to be soldered. For ensuring that the lighting element(s) are properly mounted, e.g. so that the lighting element(s) are not tilted. The lighting element(s) are tilted when e.g. their top surface is not parallel to the top surface of the substrate. Such a self-centring effect occurring during the soldering is not sufficient to avoid a tilting of the lighting element(s). By using the pre-assembly of the lighting element(s) to the temporary carrier, e.g. a tilting during the mounting of the lighting element(s) can be prevented since the reference element(s) in conjunction with the temporary carrier ensures that a tilting of the lighting element(s) can be avoided. This is achieved since the reference element(s) together with the temporary carrier keep the lighting element(s) in a proper position during the mounting.

According to an exemplary embodiment of the invention, the method further comprises: mounting the at least one reference element onto the substrate prior to or after the mounting of the at least one lighting element. The reference element(s) may be a part of the final product that is manufactured. For ensuring that the reference element(s) are permanently mounted onto the substrate, the reference element(s) may be glued and/or soldered. Other mounting techniques, like welding are also possible, but might have certain drawbacks due to the complex manufacturing process, to name but one non-limiting example.

According to an exemplary embodiment of the invention, the temporary carrier comprises an adhesive layer enabling the pre-assembling of the at least one lighting element and the at least one reference element onto the temporary carrier.

The adhesive layer may form a double sided sticky tape that is attached to or comprised by the temporary carrier. After processing, the double sided sticky tape may be removed from the temporary carrier, such that the temporary carrier may be reused. The adhesive layer attaches to the temporary carrier. Any suitable material may be used including, for example, acrylic and/or silicone. The lighting element(s) and the reference element(s) attach to adhesive layer. Accordingly, the adhesive layer is selected to securely hold the lighting element(s) and the reference element(s) in place during processing, then to release the lighting element(s) and optionally the reference element(s) after processing. Examples of suitable materials include thermal release adhesive, which acts like an adhesive at room temperature, but can be removed by heating it to a temperature above room temperature.

The adhesive material of the adhesive layer may be any material that is robust enough to connect one or more lighting elements (e.g. LEDs) togetherin some embodiments, the adhesive material is a moldable, thermoset material. Examples of suitable materials include silicone, epoxy, and glass. The adhesive material may be molded glass.

According to an exemplary embodiment of the invention, a plurality of lighting elements is pre-assembled onto the temporary carrier in a single or M×N array structure. Such a M×N refers to an array of lighting elements, wherein lighting elements are arranged in a number of M columns and N rows. To compensate e.g. thermal expansion of optics, individual reference objects for X and Y direction can be placed symmetrical or asymmetrical around the array structure. This may depend on how the substrate is designed.

The separate lighting element (e.g. LED) or arrays of lighting elements may be released from the temporary carrier by any suitable method including, for example, thermal release, transfer to a second substrate, or direct picking. The lighting element(s) may be tested, and are otherwise ready to be mounted to a substrate such as a PCB. The lighting elements can be mounted on another structure for example by soldering or any other suitable mounting technique.

According to an exemplary embodiment of the invention, the at least one reference element is a frame that enables alignment of at least one optical element to the substrate. For some applications, a frame (e.g. a guide frame) is used as a reference element. The frame may at least partially surround the lighting element(s) attached to the temporary carrier. The frame may be a guide frame, e.g. to align fingers or light guides of a pre-collimating optic, to name but one non-limiting example. Such a frame can be attached to the precisely aligned lighting elements on the temporary carrier. The frame can be mounted to the substrate, e.g. in the same manner as the lighting element(s). The frame may be used for aligning one or more further elements, such as optical elements (e.g. reflector or lens) to the substrate enabling an alignment chain of accurately aligned lighting element(s) in relation to the substrate, and due to the mounting of the frame as a reference element to the substrate, also accurate alignment of e.g. an optical element in relation to the substrate.

If it is required to place the reference element(s) in a larger distance from the lighting element, or a plurality (e.g. at least two) of lighting elements, an additional stiff frame can be used with the temporary carrier. In case the temporary carrier is or comprises an adhesive layer (e.g. tape), it is enabled to keep the tape straight during mounting, e.g. reflow soldering, to name but one non-limiting example. For instance, the frame can be metal or plastic part as well as FR4 sheet.

The features and example embodiments of the invention described above may equally pertain to the different aspects according to the present invention. In particular, with the disclosure of features relating to the carrier and the lighting device according to the first and second aspect, also corresponding features relating to the method according to the third aspect are disclosed.

It is to be understood that the presentation of embodiments of the invention in this region is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

BRIEF DESCRIPTION OF THE DRAWINGS

Examples of the invention will now be described in detail with reference to the accompanying drawing, in which:

FIG. 4 shows a schematic representation of another pre-assembled temporary carrier to be mounted to a structure in a cross-sectional view;

DETAILED DESCRIPTION OF THE EMBODIMENTS

Figure 1A:
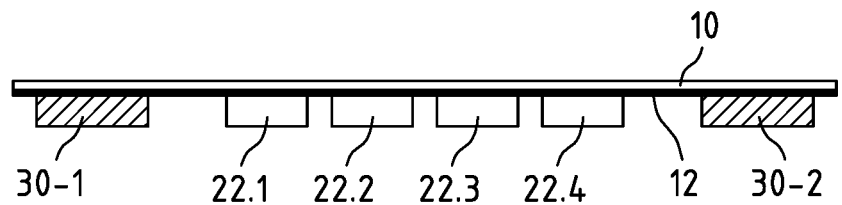
FIG. 1a shows a schematic representation of an embodiment of a temporary carrier in a cross-sectional view.

FIG. 1a shows a schematic representation of a first embodiment of a temporary carrier 10 in a perspective view. Onto the temporary carrier 10, two reference elements 30-1 and 30-2 are mounted, e.g. attached to a sticky tape. Further, a lighting element array 20 is attached to the temporary carrier 10. In FIG. 1a, four lighting elements 22-1 to 22-4 of the 2×4 lighting element array 20 are viewable. For attaching the reference elements 30-1 and 30-2 and the lighting element array 20 to the temporary carrier 10, an adhesive layer 12 is comprised by the temporary carrier 10. The top side of the temporary carrier 10 may be a foil 14 (see e.g. FIG. 5b), which can be removed (e.g. peeled off).

Figure 1B:
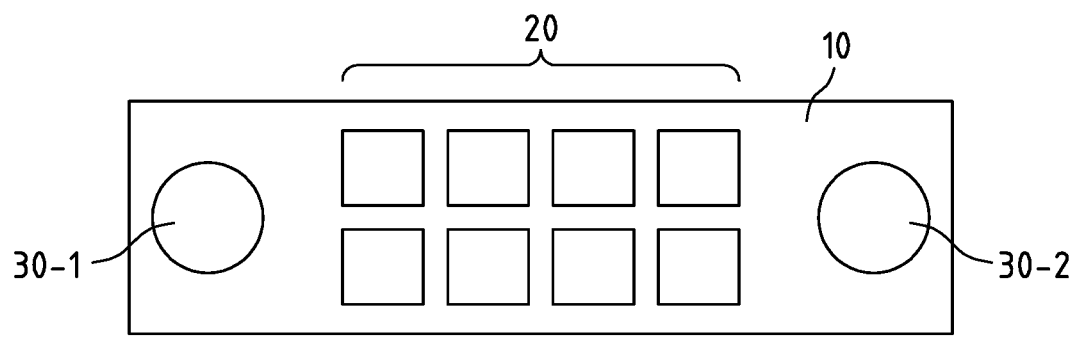
FIG. 1b shows the schematic representation of FIG. 1a of the embodiment of the temporary carrier in a top view.

FIG. 1b shows the schematic representation of FIG. 1a of the embodiment of the temporary carrier 10 in a top view. It can be seen that the two reference elements 30-1 and 30-2 are of circular shape and are located on the left and the right side of the 2×4 lighting element array 20. The two reference elements 30-1 and 30-2 provide a mechanical stop for the pre-assembled temporary carrier 10 with the lighting element array 20 when the lighting elements 22 of the lighting element array 20 are to be mounted to a substrate 40 (see e.g. FIG. 2). As an alternative to the 2×4 lighting element array 20, a single lighting element (e.g. LED die emitter), or a M×N array may be comprised by or attached to the temporary carrier 10. For instance, for the application of a Luxeon NEO Exact, the lighting elements of such a lighting element array may be spaced closely or positioned in close relation to each other. Further, e.g. for the application of a Luxeon Neo, the lighting elements of such a lighting element array may be spaced widely or positioned in a wider relation compared to the aforementioned case to each other.

The temporary carrier 10 as described above may form a pre-assembly structure, as disclosed above. This pre-assembly structure can be used by customers as standard SMD component, supplied in tape and reel packing and can be assembled with SMT machines and reflow soldering to PCBs or isolated metal substrates (IMS), to name but a few non-limiting examples. The mechanical reference elements 30-1 and 30-2 can be soldered to the PCB copper surface (solder pads) at the same time.

Figure 2:
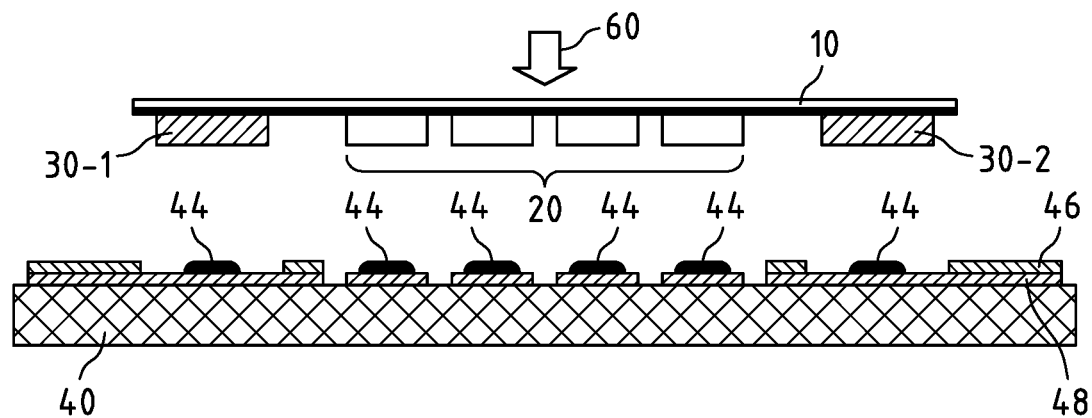
FIG. 2 shows a schematic representation of a pre-assembled temporary carrier to be mounted to a structure in a cross-sectional view.

FIG. 2 shows a schematic representation of a pre-assembled temporary carrier 10 to be mounted to a structure 40 in a cross-sectional view. The lighting elements 22 attached to the temporary carrier 10 are to be mounted (e.g. soldered) to the substrate 40. The position at which the lighting elements 22 of the lighting element array 20, and the two reference elements 30-1 and 30-2 are to be mounted, solder paste 44 is applied. The substrate 40 has a copper trace on its top side to which e.g. the lighting elements 22 and/or the reference elements 30 can be soldered. Further, at sections of the substrate 40 to which an attaching of e.g. the lighting elements 22 and/or the reference elements 30 should be avoided, a respective solder mask 46 is applied. As indicated by the arrow 60, the temporary carrier 10 comprising the lighting elements 22 and the reference elements 30 can be positioned in its intended position in relation to the substrate 40. Then, e.g. by a reflow soldering, the lighting elements 22 and/or the reference elements 30 are soldered to the substrate 40. Thus, this pick and place process 60 can be used to manufacture a structure comprising one or more elements, e.g. the lighting elements 22 that are mounted (here: soldered) to the substrate 40 via utilizing the temporary carrier 10. The substrate 40 may be a PCB.

Figure 3A:
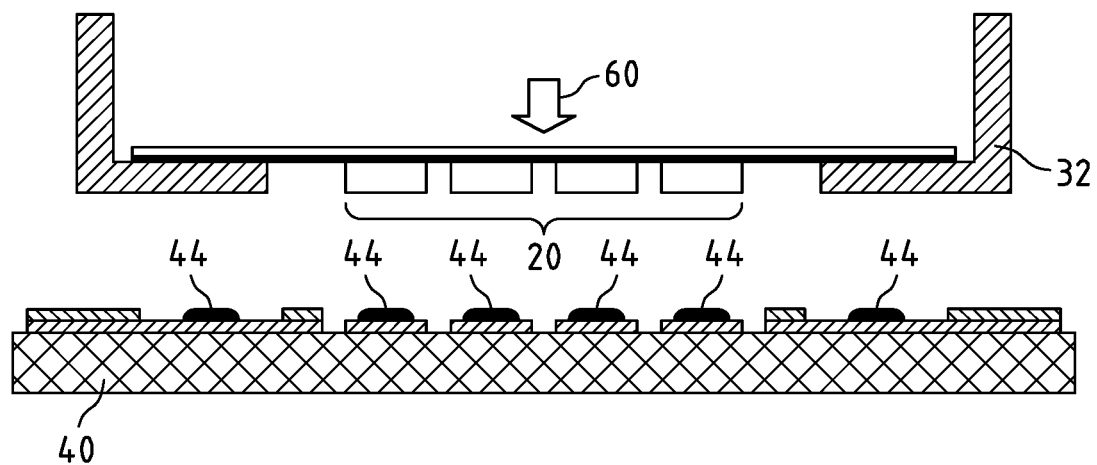
FIG. 3a shows a schematic representation of another pre-assembled temporary carrier to be mounted to a structure in a cross-sectional view.

FIG. 3a shows a schematic representation of another pre-assembled temporary carrier 10 to be mounted to a structure in a cross-sectional view. In comparison to the temporary carrier 10 of the embodiments shown in FIGS. 1a, 1b and 2, the reference element is a frame 32. The frame 32 may for instance be used to mount one or more optical elements, such as a reflector or a lens to the frame 32, and/or using the frame 32 to align one or more of such optical elements in relation to the substrate 40. The mounting of the lighting elements 22 and/or of the frame 32 may be performed in the same way as described above.

Figure 3B:
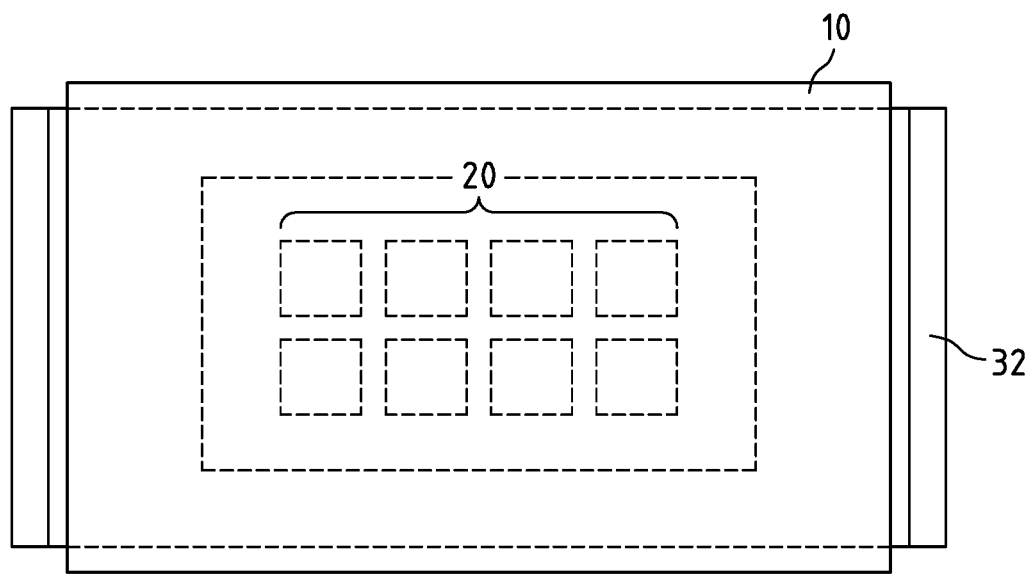
FIG. 3b shows the schematic representation of FIG. 3a in a top view.

FIG. 3b shows the schematic representation of FIG. 3a in a top view. It can be seen that the frame 32 surrounds the lighting element array 20 (at present a 2×4 LED array) at all sides. The frame 32 comprises a cut-out section in which the lighting element array 20 can be attached. The frame 32 comprises vertical side walls extending beyond the top surface of the temporary carrier 10. The vertical side walls may for instance be used for aligning and/or mounting one or more optical elements, such as a reflector or a lens to the frame 32.

FIG. 4 shows a schematic representation of another pre-assembled temporary carrier 10 to be mounted to a structure 40 in a cross-sectional view. The substrate 40 which is to be mounted with the lighting elements array 20 comprised by the temporary carrier 10, has glue 50 attached to it at positions, where the reference elements 30-1 and 30-2 are to be glued to. Further, at positions, where the lighting elements 22 of the lighting element array 20 are to be mounted, solder paste 44 is coated. The reference element 30-2 may have a fiducial that can be used for optical recognition, e.g. enabling to align the temporary carrier 10 to a reference hole 52 that is drilled into the substrate 40. The fiducial cannot be seen in the FIG. 4 since it is a dent/recess on the top side of the reference element 30-2. It will be understood that such a fiducial can be comprised by the reference element 30-1, or be comprised as a dent/recess on the top side shown in FIG. 4 of the temporary carrier 10, too. The pick and place process 60 can utilize such fiducials and/or reference holes 52.

Figure 5A:
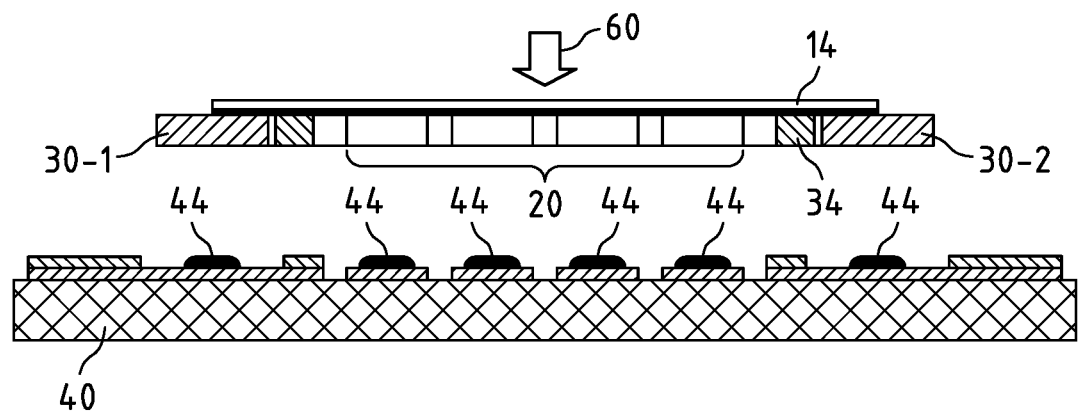
FIG. 5a shows a schematic representation of another pre-assembled temporary carrier to be mounted to a structure in a cross-sectional view.
Figure 5B:
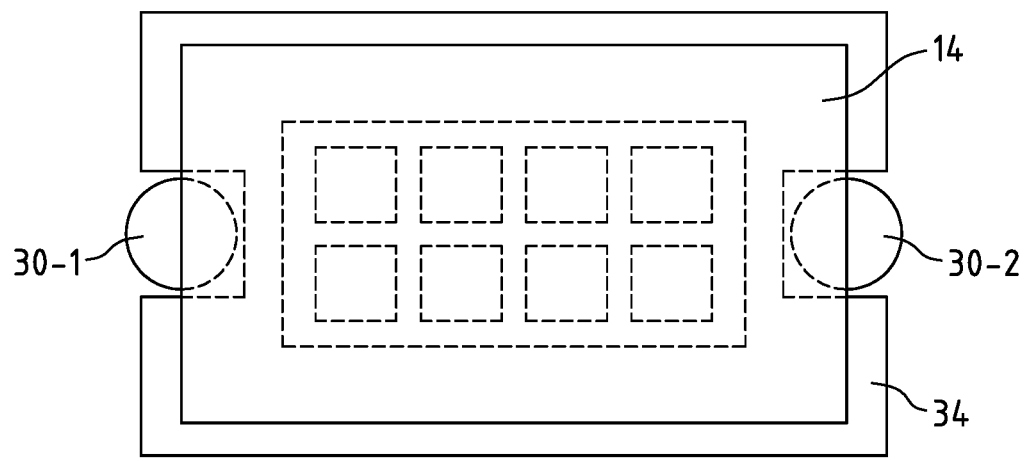
FIG. 5b shows the schematic representation of FIG. 5a in a top view.

FIG. 5a shows a schematic representation of another pre-assembled temporary carrier to be mounted to a structure in a cross-sectional view. FIG. 5b shows the schematic representation of FIG. 5a in a top view. The temporary carrier 10 comprises a temporary frame 34 as one of its reference elements. Further reference elements comprised by the temporary carrier 10 are the reference elements 30-1 and 30-2 of circular shape. A foil 14 of the temporary carrier 10 having an adhesive layer ensures that the reference elements 30-1, 30-2 and 34 at least temporary stick to the temporary carrier 10, e.g. until the lighting element array 20 also comprised by the temporary carrier 10 are mounted to the substrate. The temporary frame 34 may for instance be removed from the substrate after the lighting element array 20 is successfully mounted to the substrate. The temporary frame 34 at least temporarily fixes the lighting element array 20 during the mounting process in relation to the substrate 40 by at least two degrees of freedom.

Such a frame 34 increases the stability of the temporary carrier 10, in particular of a foil 14 comprised by the temporary carrier 10. This further increases the tolerances for warping and the like, that may occur during the mounting of at least the lighting elements onto a substrate.

Figure 6A:
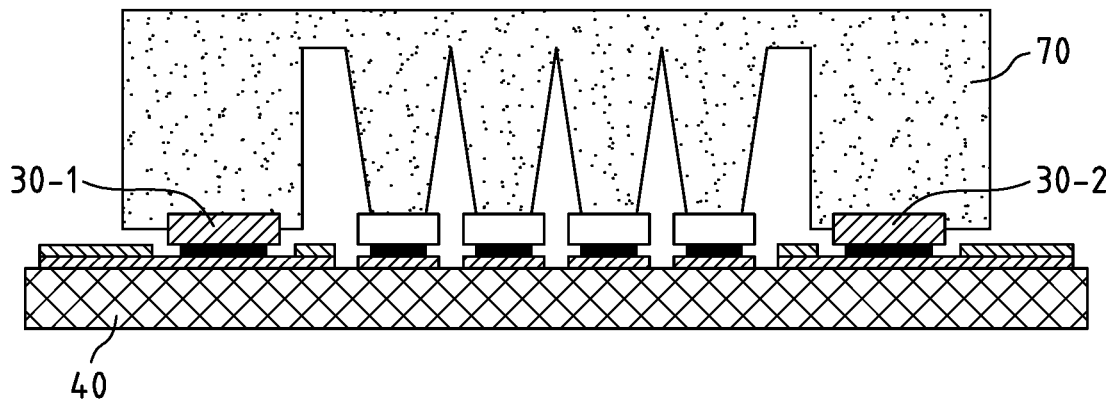
FIG. 6a shows a schematic representation of an assembled structure with an optical element in a cross-sectional view.
Figure 6B:
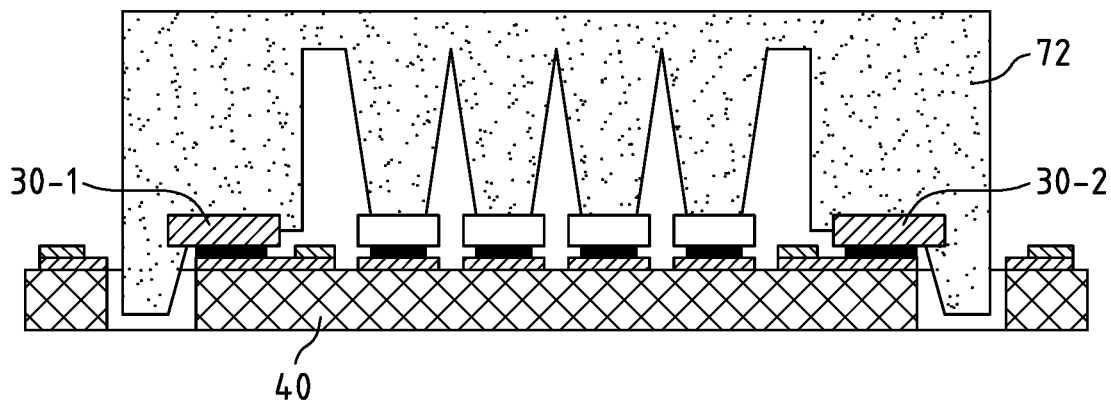
FIG. 6b shows a schematic representation of an assembled structure with another, second optical element in a cross-sectional view.

FIG. 6a to FIG. 6b show schematic representation of an assembled structure (e.g. final product representing a sub-element for an automotive headlamp) with three different optical elements mounted to the substrate 40 in a cross-sectional view. In FIG. 6a, it can be seen that the circular reference elements 30-1 and 30-2 are also used to align the optical element 70 to the substrate. At present, the optical element is a pre-optic 70. The pre-optic comprises light guides aligned in relation to the lighting elements 22 of the lighting element array 20 enabling that the lighting elements 22 can emit light at least in a direction as defined by the light guides.

The optical element 72 shown FIG. 6b also utilizes the circular reference elements 30-1 and 30-2: the optical element 72 has a certain shape allowing it to snap-in beneath the reference elements 30-1 and 30-2. Thus, the optical element 70 is also a pre-optic, wherein it comprises at least one hook-shaped ending allowing the optical element to be attached to the substrate by snapping-in under the circular reference elements 30-1 and 30-2. The reference elements 30-1 and 30-2 are mounted to the substrate 40 in a fixed manner so that the reference elements 30-1 and 30-2 cannot be removed during normal usage.

Figure 6C:
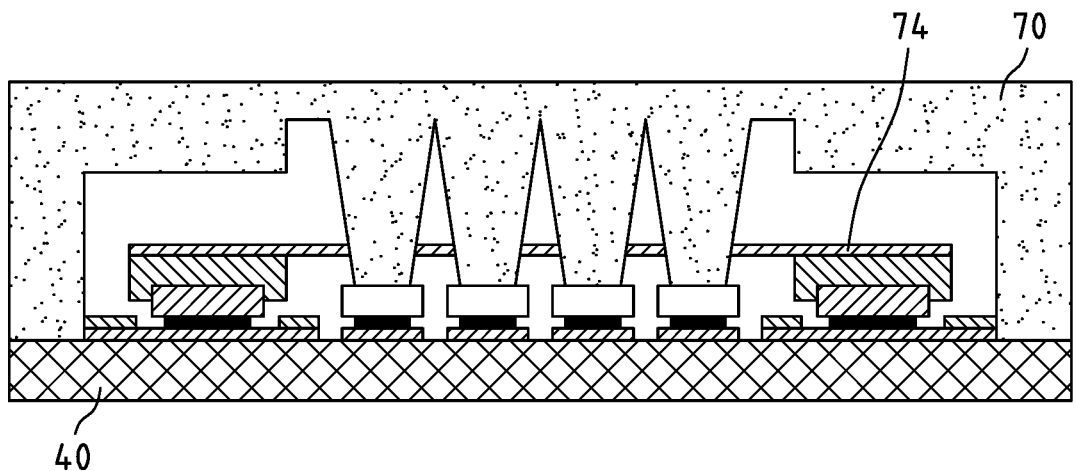
FIG. 6c shows a schematic representation of an assembled structure with another, third optical element in a cross-sectional view.

The embodiment shown in FIG. 6c additionally comprises a guide frame 74 for additional alignment of the optical element 70 (at present: a pre-optic). The guide frame 74 is aligned and mounted to the reference elements 30-1 and 30-2 that are permanently mounted to the substrate 40. The light guides aligned in relation to the lighting elements 22 of the lighting element array 20 may for instance utilize the guide frame 74, so that the pre-optic 70 is also aligned by the guide frame 74. The guide frame 74 may be a metal sheet with one or more holes allowing the light guides of the pre-optic 70 to penetrate the holes. Thus, the holes enable additional alignment of the pre-optic 70.

Figure 7A:
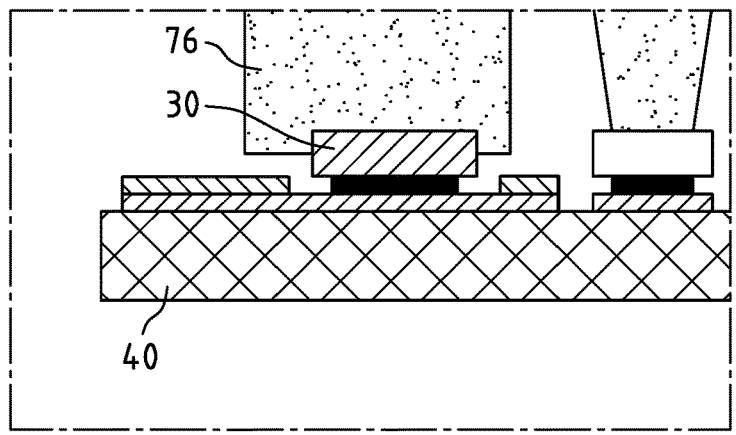
FIG. 7a-7d show schematic representations of assembled structures with different aligned objects.
Figure 7B:
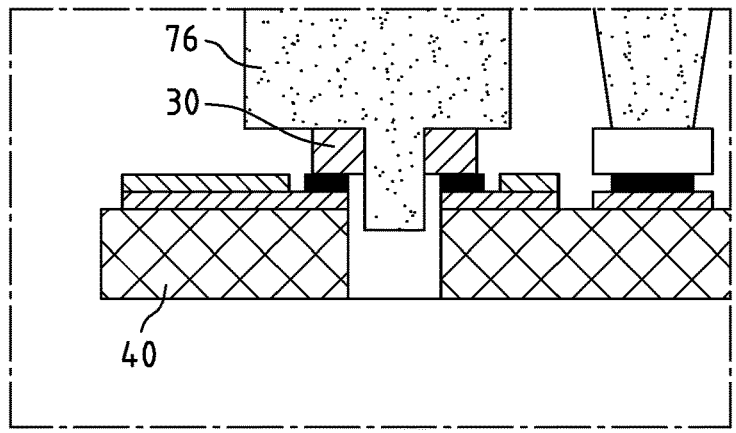
Figure 7C:
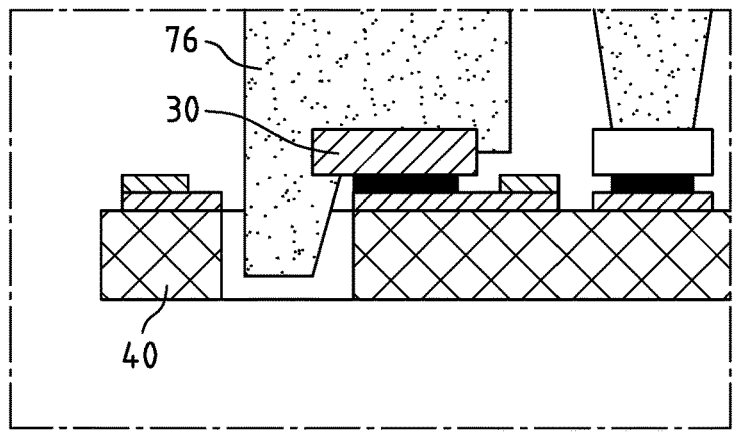
Figure 7D:
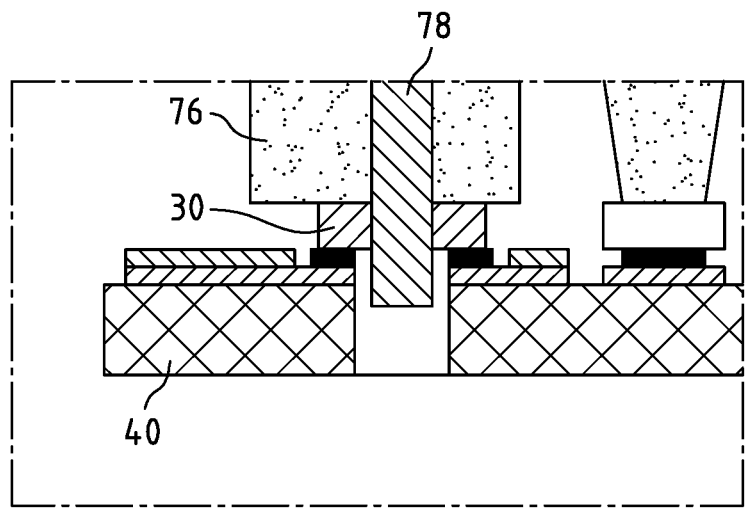

FIG. 7a to FIG. 7d show schematic representations of assembled structures with different aligned objects. The reference element 30 of FIG. 7a is used to align the object 76 in at least two directions. It can be seen that the object 76 is in no direct contact with the substrate 40. The object 76 has a recess of a shape corresponding to the reference element 30, e.g. a circular recess. Thus, such a recess of the object 76 to be aligned may form-fit to the reference element 30. The aligned object 76 of FIG. 7b has a protruding section that can be put through a reference element that has a corresponding hole, and that is mounted (e.g. soldered) to the substrate 40. The aligned object 76 of FIG. 7c has a snap-in geometry so that the object 76 can snap-in beneath of the reference element 30. The reference element 30 is mounted (e.g. soldered) to the substrate 40 permanently. The object 76 of FIG. 7d is aligned by a pin 78 that penetrates both a hole of the object 76 and a hole comprised by the reference element 30. The reference element 30 is permanently mounted (e.g. soldered) to the substrate 40. It can be seen that the reference element as disclosed in the present invention can serve further alignment purposes besides providing enhanced ease of mounting of the lighting element(s) to a substrate, e.g. by preventing tilting of lighting element(s) during the mounting (e.g. soldering and/or gluing).

Figure 8:
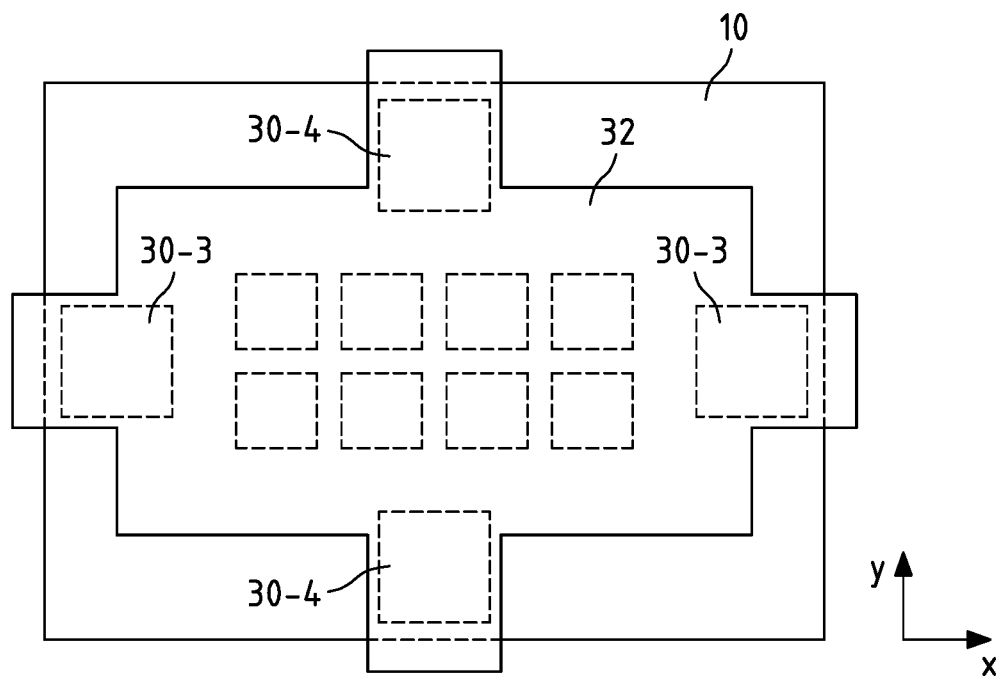
FIG. 8 shows a schematic representation of an embodiment of a temporary carrier in a top view enabling alignment in two directions.

FIG. 8 shows a schematic representation of an embodiment of a temporary carrier 10 in a top view enabling alignment in two directions. The temporary carrier 10 has four reference elements, two of them (reference elements 30-3) for enabling alignment in Y-direction, and two of them (reference elements 30-4) for enabling alignment in X-direction. For illustrative purpose, the X- and Y-axis are drawn in FIG. 8.

Further, the temporary carrier 10 comprises a frame 32 that enables alignment of a geometry at an optical element (e.g. optics). In the middle of the frame 32, at present a 2×4 lighting element array 20 is attached to the temporary carrier. The attachment of the lighting elements 22 of the lighting element array 20, and of the reference elements 30-3 and 30-4 may be done in the same way as disclosed above.

The temporary carrier as disclosed in example embodiments according to all aspect may represent a L1 or a L2 element. A level 1 element has this temporary carrier with a mechanical reference as a corresponding reference element, and/or a level 2 element which has used this type of assembly method, enable a characteristic positional pattern where the tolerance between the lighting element(s), e.g. LEDs and one or more optical elements (e.g. optics) is enhanced. Further, putting such a substrate, e.g. a level 2 element a second time through a reflow soldering process may cause even more enhanced alignment of the lighting elements (e.g. LEDs) due to additional self-centering effects happening during the second reflow soldering.

The optical element(s) could also be shutter or sheet masks (e.g. cut-off or strip masks), which have optical functionality. Additionally or alternatively, the optical element(s) may be connecting elements providing a possibility to mount or attach one or more optics (e.g. reflector or lens) to the connecting element(s). Thus, at such a connecting element, an optical element (e.g. reflector or lens) can be aligned or referenced to.

REFERENCE SIGNS 10 temporary carrier
12 adhesive layer
14 foil
20 lighting array
22 lighting element
30 reference element
32 reference element: frame
34 reference element: temporary frame
40 substrate
42 solder contact
44 solder paste
46 solder mask
48 copper trace
50 glue
52 reference hole
60 pick and place process
70 optical element: pre-optics
72 optical element: pre-optics for snap-in mounting
74 guide frame for alignment of optical element
76 aligned object
78 pin

The invention claimed is:

1. A method for assembling at least one lighting element onto a substrate, comprising:
    pre-assembling at least one lighting element onto a temporary carrier;
    pre-assembling at least one reference element onto the temporary carrier, the at least one reference element having an equal or greater thickness as the at least one lighting element and providing a mechanical stop for aligning the pre-assembled temporary carrier in at least one direction chosen from a first direction, a second direction perpendicular to the first direction, and a third direction perpendicular to the second direction, the at least one reference element comprising at least one fiducial providing a mechanical stop for aligning the pre-assembled temporary carrier in the first direction and/or for enabling optical alignment of the pre-assembled temporary carrier;
    aligning the pre-assembled temporary carrier onto the substrate based, at least in part, on the at least one reference element of the temporary carrier; and
    mounting the at least one lighting element onto the substrate, wherein the at least one light element comprises a material not comprised in the at least one reference element.

2. The method according to claim 1, further comprising:
    removing the temporary carrier from the substrate when the at least one lighting element is permanently attached to the substrate.

3. The method according to claim 1, wherein at least one fiducial is a dent or recess on a top side of the at least one reference element.

4. The method according to claim 1, wherein the pre-assembled temporary carrier is aligned to the substrate by a pick and place process.

5. The method according to claim 1, wherein the substrate is a printed circuit board.

6. The method according to claim 1, wherein the at least one lighting element is mounted to the substrate by gluing or soldering it onto the substrate.

7. The method according to claim 1, further comprising:
    mounting the at least one reference element onto the substrate prior to or after the mounting of the at least one lighting element.

8. The method according to claim 1, wherein the temporary carrier comprises an adhesive layer enabling the pre-assembling of the at least one lighting element and the at least one reference element onto the temporary carrier.

9. The method according to claim 1, wherein a plurality of lighting elements are pre-assembled onto the temporary carrier in a single or M×N array structure.

10. The method according to claim 1, wherein the at least one reference element is a frame that enables alignment of at least one optical element to the substrate.

11. A substrate comprising:
    at least one lighting element, wherein the at least one lighting element is assembled onto the substrate by a method according to claim 1.

12. The substrate according to claim 11, wherein the substrate is a printed circuit board.

13. Use of a method according to claim 1 for assembling optical components with one or more lighting elements.

14. The method according to claim 1, wherein the temporary carrier comprises a foil.

15. The method according to claim 1, wherein mounting the at least one lighting element onto the substrate comprises reflow soldering the at least one lighting element onto the substrate.

16. The method according to claim 1, further comprising reflow soldering the at least one reference element to the substrate.

17. The method according to claim 1, wherein aligning the pre-assembled temporary carrier onto the substrate comprises aligning each of the at least one lighting element and the at least one reference element to solder paste coated on the substrate.

18. The method according to claim 1, wherein the temporary carrier is or comprises a tape.

19. The method according to claim 1, the substrate comprises at least one conductive trace, and aligning the pre-assembled temporary carrier onto the substrate is based, at least in part, on aligning the at least one lighting element to a respective one of the at least one conductive trace, without aligning the at least one reference element to a respective one of the at least one conductive trace.

* * * * *